US012120442B2

(12) United States Patent
Ichihashi

(10) Patent No.: US 12,120,442 B2
(45) Date of Patent: Oct. 15, 2024

(54) DRIVER CIRCUIT AND IMAGING DEVICE

(71) Applicant: SONY SEMICONDUCTOR SOLUTIONS CORPORATION, Kanagawa (JP)

(72) Inventor: Masahiro Ichihashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 22 days.

(21) Appl. No.: 17/760,170

(22) PCT Filed: Dec. 28, 2020

(86) PCT No.: PCT/JP2020/047410
§ 371 (c)(1),
(2) Date: Aug. 4, 2022

(87) PCT Pub. No.: WO2021/161658
PCT Pub. Date: Aug. 19, 2021

(65) Prior Publication Data
US 2023/0049639 A1    Feb. 16, 2023

(30) Foreign Application Priority Data
Feb. 12, 2020    (JP) ............... 2020-021605

(51) Int. Cl.
*H04N 25/709*    (2023.01)
*H02M 3/158*    (2006.01)
(52) U.S. Cl.
CPC ........ *H04N 25/709* (2023.01); *H02M 3/1582* (2013.01)

(58) Field of Classification Search
CPC . H04N 25/709; H04N 25/779; H02M 3/1582; H03K 19/00; H03K 19/0175
See application file for complete search history.

(56) References Cited

U.S. PATENT DOCUMENTS

2006/0232297 A1* 10/2006 Tanimoto ....... H03K 19/018571
326/86
2006/0262068 A1* 11/2006 Nohtomi ............. G09G 3/3688
345/98

(Continued)

FOREIGN PATENT DOCUMENTS

| JP | 2006-279883 A | 10/2006 |
| JP | 2006-323040 A | 11/2006 |
| JP | 2012-038401 A | 2/2012 |

OTHER PUBLICATIONS

International Search Report and Written Opinion of PCT Application No. PCT/JP2020/047410, issued on Mar. 16, 2021, 09 pages of ISRWO.

*Primary Examiner* — Jason A Flohre
(74) *Attorney, Agent, or Firm* — CHIP LAW GROUP

(57) ABSTRACT

To reduce power consumption of a driver circuit used in a vertical drive circuit of an image processing device.
In the driver circuit, a drive signal output circuit outputs a drive signal in accordance with a predetermined trigger signal. Furthermore, at a time of rising of the drive signal, a step-up switch sequentially selects a plurality of voltages in ascending order, and supplies the selected voltage to the drive signal output circuit. Moreover, at a time of falling of the drive signal, a step-down switch sequentially selects a plurality of voltages in descending order, and supplies the selected voltage to the drive signal output circuit.

9 Claims, 12 Drawing Sheets

(56) References Cited

U.S. PATENT DOCUMENTS

| | | | |
|---|---|---|---|
| 2009/0086077 A1* | 4/2009 | Wada | H04N 25/445 |
| | | | 348/308 |
| 2012/0042188 A1* | 2/2012 | Hirano | H03K 3/012 |
| | | | 713/300 |
| 2015/0124133 A1* | 5/2015 | Kawazu | H04N 25/75 |
| | | | 250/208.1 |
| 2020/0145571 A1* | 5/2020 | Xu | H04N 25/778 |
| 2020/0145597 A1* | 5/2020 | Prathipati | H04N 25/74 |

* cited by examiner

DRIVER CIRCUIT AND IMAGING DEVICE

CROSS REFERENCE TO RELATED APPLICATIONS

This application is a U.S. National Phase of International Patent Application No. PCT/JP2020/047410 filed on Dec. 18, 2020, which claims priority benefit of Japanese Patent Application No. JP 2020-021605 filed in the Japan Patent Office on Feb. 12, 2020. Each of the above-referenced applications is hereby incorporated herein by reference in its entirety.

TECHNICAL FIELD

The present technology relates to a driver circuit. Specifically, the present technology relates to a driver circuit that outputs a drive signal in accordance with a trigger signal, and an imaging device that drives a pixel by the drive signal outputted from the driver circuit.

BACKGROUND ART

With an increase in speed and size of imaging devices, a driver circuit that drives a pixel region also requires high drive capability. Therefore, a technique for improving drive capability in the driver circuit has been proposed. For example, there has been proposed a driver circuit that increases a gate-to-source voltage of a transistor in the driver circuit to increase a current flowing between a source and a drain to improve drive capability (see, for example, Patent Document 1).

CITATION LIST

Patent Document

Patent Document 1: Japanese Patent Application Laid-Open No. 2006-279883

SUMMARY OF THE INVENTION

Problems to be Solved by the Invention

In the above-described related art, drive capability is improved by increasing a gate-to-source voltage. However, since an output voltage of the driver circuit is defined between a power supply voltage and a ground potential, a step-up circuit is required to output a voltage higher than the power supply voltage, and a step-down circuit is required to output a voltage lower than the ground potential. In this case, a large amount of power is extracted from the step-up circuit and the step-down circuit, which may be a problem from the viewpoint of power consumption. Furthermore, an increase in power consumption may be a factor that hinders high integration of the driver circuit from the viewpoint of thermal design.

The present technology has been made in view of such a situation, and an object thereof is to reduce power consumption of a driver circuit.

Solutions to Problems

The present technology has been made to solve the above-described problems, and a first aspect thereof is a driver circuit including: a drive signal output circuit configured to output a drive signal in accordance with a predetermined trigger signal; a step-up switch configured to sequentially select a plurality of voltages in ascending order and supply a selected voltage to the above-described drive signal output circuit, at a time of rising of the above-described drive signal; and a step-down switch configured to sequentially select a plurality of voltages in descending order and supply a selected voltage to the above-described drive signal output circuit, at a time of falling of the above-described drive signal. This configuration brings about an effect of dispersing a load required for charging and discharging of the drive signal.

Furthermore, in this first aspect, there may be further included a control circuit configured to perform control by generating a selection signal in the above-described step-up switch and the above-described step-down switch, on the basis of the above-described trigger signal. This configuration brings about an effect of controlling selection in the step-up switch and the step-down switch, on the basis of the trigger signal.

Furthermore, this first aspect may be adapted such that, at a time of rising of the above-described drive signal, the above-described step-up switch selects a first voltage until the above-described first voltage is reached, and selects a second voltage higher than the above-described first voltage until the above-described second voltage is reached, to supply to the above-described drive signal output circuit, and, at a time of falling of the above-described drive signal, the above-described step-down switch selects a third voltage until the above-described third voltage is reached, and selects a fourth voltage lower than the above-described third voltage until the above-described fourth voltage is reached, to supply to the above-described drive signal output circuit. This configuration brings about an effect of controlling the driver circuit with four amplitude levels.

Furthermore, in this first aspect, there may be further included: a step-up circuit configured to generate the above-described second voltage and supply to the above-described step-up switch; and a step-down circuit configured to generate the above-described fourth voltage and supply to the above-described step-down switch, in which the above-described first voltage may be a power supply voltage, and the above-described third voltage may be a ground potential. This configuration brings about an effect of performing charging and discharging by the step-up circuit or the step-down circuit, after precharging with the power supply voltage or predischarging with the ground potential.

Furthermore, in this first aspect, a capacitor configured to connect between the above-described power supply voltage and the above-described ground potential may be further included. This configuration brings about an effect of supplying a necessary current in the driver circuit.

Furthermore, in this first aspect, a voltage control bias circuit configured to perform control to supply a voltage within a withstand voltage of a transistor to the transistor included in the above-described drive signal output circuit may be further included. This configuration brings about an effect that an amplitude exceeding the withstand voltage of the transistor is not applied.

Furthermore, in this first aspect, a current control bias circuit configured to control a current flowing through transistors included in the above-described step-up switch and the above-described step-down switch may be further included. This configuration brings about an effect of controlling a slew rate.

Furthermore, a second aspect of the present technology is an imaging device including: a pixel region in which a plurality of imaging elements is arranged; and a plurality of driver circuits including, individually corresponding to the above-described plurality of imaging elements, a drive signal output circuit configured to output a drive signal to each of the above-described imaging elements in accordance with a predetermined trigger signal, a step-up switch configured to sequentially select a plurality of voltages in ascending order to supply to the above-described drive signal output circuit at a time of rising of the above-described drive signal, and a step-down switch configured to sequentially select a plurality of voltages in descending order to supply to the above-described drive signal output circuit at a time of falling of the above-described drive signal. This configuration brings about an effect of dispersing a load required for charging and discharging of the drive signal in the imaging device.

Furthermore, in this second aspect, there may be further included, for each predetermined number of the above-described plurality of driver circuits, a bias circuit configured to supply a voltage within a withstand voltage of a transistor to the transistor included in the above-described drive signal output circuit, and control a current flowing through transistors included in the above-described step-up switch and the above-described step-down switch. This configuration brings about an effect that, in accordance with a power supply drop at an arrangement position of the driver circuit, a bias voltage is also dropped by the same amount.

Furthermore, in this second aspect, the above-described bias circuit each may be connected in a daisy chain shape. This configuration brings about an effect of reducing the number of wiring lines.

MODE FOR CARRYING OUT THE INVENTION

Hereinafter, an embodiment for implementing the present technology (hereinafter, referred to as an embodiment) will be described. The description will be made in the following order.

1. Imaging device and driver circuit
2. Slew rate control
3. EMI
4. Bias circuit <1. Imaging Device and Driver Circuit>

[Imaging Device]

Figure 1:
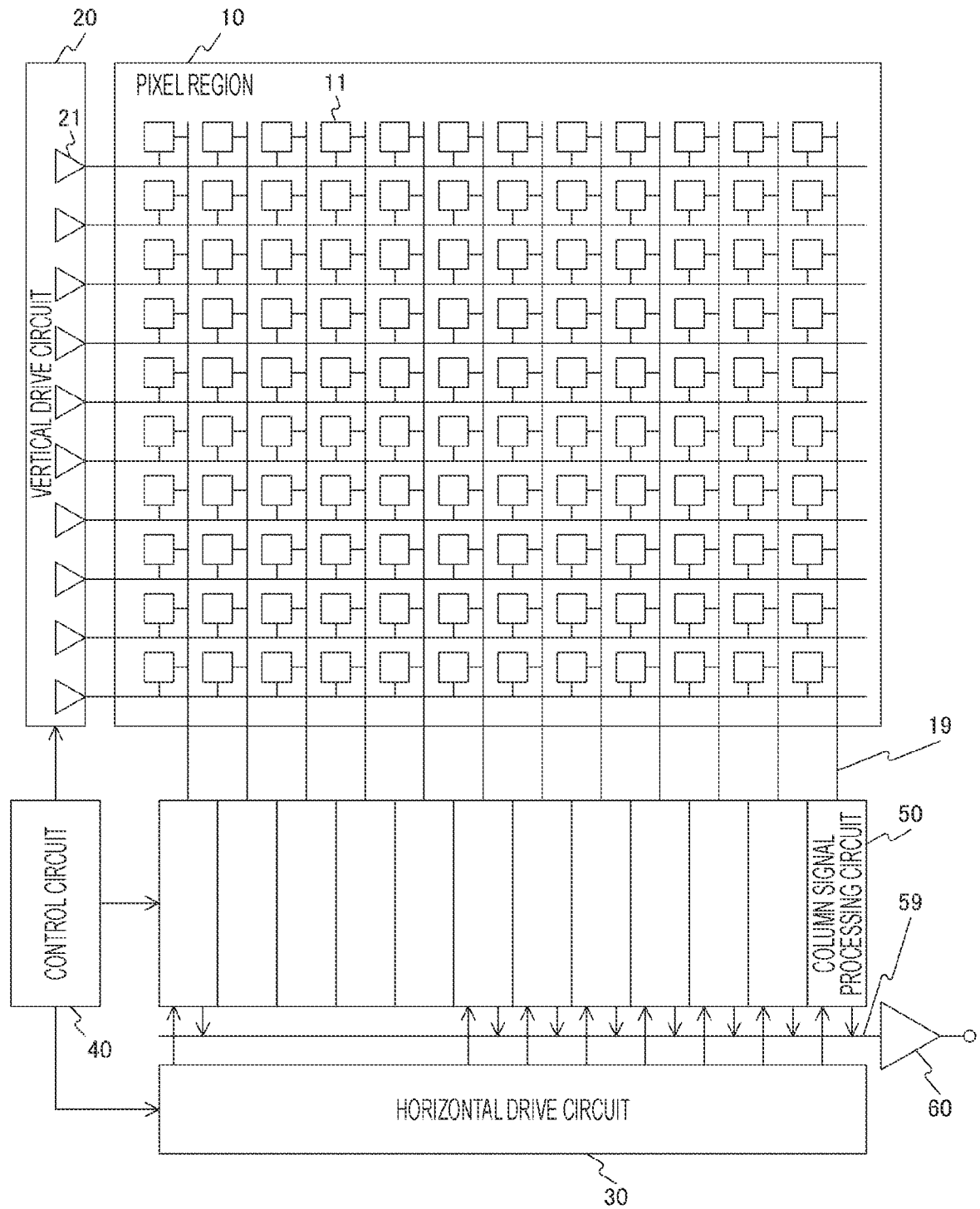
FIG. 1 is a diagram illustrating a configuration example of an imaging device including a driver circuit according to an embodiment of the present technology.

FIG. 1 is a diagram illustrating a configuration example of an imaging device including a driver circuit according to an embodiment of the present technology. This imaging device includes a pixel region 10 and a peripheral circuit unit. The peripheral circuit unit includes a vertical drive circuit 20, a horizontal drive circuit 30, a control circuit 40, a column signal processing circuit 50, and an output circuit 60.

The pixel region 10 is a pixel array in which a plurality of pixels 11 including a photoelectric conversion unit is arranged in a two-dimensional array. This pixel 11 includes, for example, a photodiode serving as a photoelectric conversion unit, and a plurality of pixel transistors. Here, the plurality of pixel transistors can include, for example, four transistors of a transfer transistor, a reset transistor, a selection transistor, and an amplification transistor.

The vertical drive circuit 20 is to drive the pixels 11 on a row basis. This vertical drive circuit 20 includes a driver circuit 21 for each pixel drive wiring line, and supplies a drive signal for driving the pixel 11 to a selected pixel drive wiring line. As a result, the vertical drive circuit 20 selectively scans the individual pixels 11 of the pixel region 10 sequentially in a vertical direction on a row basis, and supplies a pixel signal based on a signal charge generated in accordance with an amount of received light in the photoelectric conversion unit of each pixel 11, to the column signal processing circuit 50 via a vertical signal line 19.

The horizontal drive circuit 30 is to drive the column signal processing circuits 50 on a column basis. This horizontal drive circuit 30 is configured by, for example, a shift register. This horizontal drive circuit 30 sequentially selects each of the column signal processing circuits 50 by sequentially outputting horizontal scanning pulses, and causes each of the column signal processing circuits 50 to output a pixel signal to the output circuit 60 via a horizontal signal line 59.

The control circuit 40 is to control the entire imaging device. This control circuit 40 receives an input clock and data instructing an operation mode and the like, and outputs data such as internal information of the imaging device. That is, this control circuit 40 generates a clock signal or a control signal serving as references of operations of the vertical drive circuit 20, the column signal processing circuit 50, the horizontal drive circuit 30, and the like on the basis of a vertical synchronization signal, a horizontal synchronization signal, and a master clock. Then, these signals are inputted to the vertical drive circuit 20, the column signal processing circuit 50, the horizontal drive circuit 30, and the like.

The column signal processing circuit 50 is arranged, for example, for every column of the pixels 11, and is to perform signal processing such as noise removal for every pixel column on signals outputted from the pixels 11 of one row. That is, this column signal processing circuit 50 performs signal processing such as correlated double sampling (CDS) for removing fixed pattern noise unique to the pixel 11, signal amplification, and analog to digital (AD) conversion. In an output stage of the column signal processing circuit 50, a horizontal selection switch (not illustrated) is connected between with the horizontal signal line 59.

The output circuit 60 is to perform signal processing on signals sequentially supplied from each of the column signal processing circuits 50 through the horizontal signal line 59, and output the signals. At that time, this output circuit 60 buffers signals from the column signal processing circuit 50. Furthermore, this output circuit 60 may perform black level adjustment, column variation correction, various types of digital signal processing, and the like on the signals from the column signal processing circuit 50.

[Driver Circuit]

Figure 2:
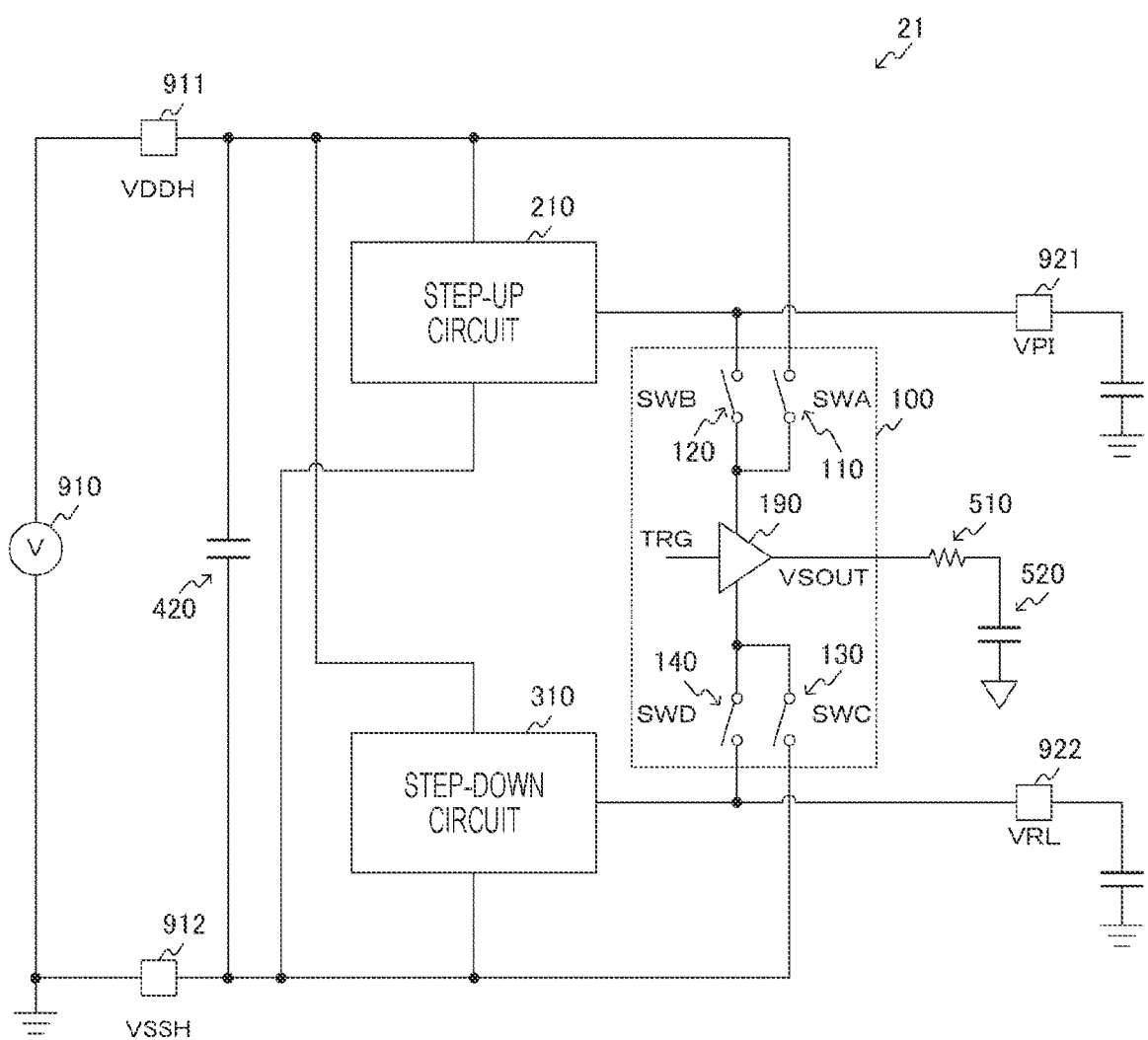
FIG. 2 is a diagram illustrating a block configuration example of a driver circuit 21 according to the embodiment of the present technology.

FIG. 2 is a diagram illustrating a block configuration example of the driver circuit 21 according to the embodiment of the present technology.

The driver circuit 21 includes a drive signal output circuit 190, an A switch 110, a B switch 120, a C switch 130, a D switch 140, a step-up circuit 210, a step-down circuit 310, and a capacitor 420.

Furthermore, this driver circuit 21 includes pads 911, 912, 921, and 922. Between the pads 911 and 912, a power supply 910 is connected. A power supply voltage VDDH is supplied to the pad 911, and a ground potential VSSH is supplied to the pad 912. To the pad 921, an output voltage VPI of the step-up circuit 210 is supplied. Furthermore, to the pad 922, an output voltage VRL of the step-down circuit 310 is supplied. Here, the output voltage VPI of the step-up circuit 210 is a voltage higher than the power supply voltage VDDH. Furthermore, the output voltage VRL of the step-down circuit 310 is a voltage lower than the ground potential VSSH.

The drive signal output circuit 190 is a circuit configured to output a drive signal VSOUT in accordance with a trigger signal TRG. The drive signal VSOUT is distributed to individual pixels of a corresponding line. Here, a total wiring resistance 510 and a total parasitic capacitance 520 of the line are collectively illustrated.

The A switch 110 is a switch that selects whether or not to supply the power supply voltage VDDH to the drive signal output circuit 190. The B switch 120 is a switch that selects whether or not to supply the output voltage VPI of the step-up circuit 210 to the drive signal output circuit 190. Either one of the A switch 110 and the B switch 120 exclusively supplies a voltage to the drive signal output circuit 190, at a time of rising of the drive signal VSOUT. As a result, the power supply voltage VDDH is selected until the power supply voltage VDDH is reached, and thereafter, the voltage VPI is selected until the voltage VPI is reached, and supplied to the drive signal output circuit 190. That is, the A switch 110 and the B switch 120 sequentially select a plurality of voltages in ascending order, and supply the selected voltage to the drive signal output circuit 190. Note that the A switch 110 and the B switch 120 are examples of a step-up switch described in the claims.

The C switch 130 is a switch that selects whether or not to supply the ground potential VSSH to the drive signal output circuit 190. The D switch 140 is a switch that selects whether or not to supply the output voltage VRL of the step-down circuit 310 to the drive signal output circuit 190. Either one of the C switch 130 and the D switch 140 exclusively supplies a voltage to the drive signal output circuit 190, at a time of falling of the drive signal VSOUT. As a result, the ground potential VSSH is selected until the ground potential VSSH is reached, and thereafter, the voltage VRL is selected until the voltage VRL is reached, and supplied to the drive signal output circuit 190. That is, the C switch 130 and the D switch 140 sequentially select a plurality of voltages in descending order, and supply the selected voltage to the drive signal output circuit 190. Note that the C switch 130 and the D switch 140 are examples of a step-down switch described in the claims.

The step-up circuit 210 is to generate the output voltage VPI and supply to the B switch 120. As described above, the output voltage VPI of this step-up circuit 210 is a voltage higher than the power supply voltage VDDH.

The step-down circuit 310 is to generate the output voltage VRL and supply to the D switch 140. As described above, the output voltage VRL of this step-down circuit 310 is a voltage lower than the power supply voltage VSSH.

The capacitor 420 is a capacitive element configured to connect between the power supply voltage VDDH and the ground potential VSSH. As will be described later, when the trigger signal TRG changes, a steep current may flow. In such a case, this capacitor 420 supplies a current.

[Power Consumption]

Here, power consumption of the driver circuit 21 will be described. In this driver circuit 21, when the trigger signal TRG is applied, the A switch 110, the B switch 120, the C switch 130, and the D switch 140 are to be turned on in this order.

First, at a time of rising of the drive signal VSOUT, the A switch 110 is turned on, and charging is performed from the voltage VRL in an initial state to the power supply voltage VDDH. Thereafter, when the power supply voltage VDDH is reached, the B switch 120 is then turned on, and charging is performed from the power supply voltage VDDH to the voltage VPI. That is, instead of charging from the voltage VRL to the voltage VPI all at once, charging is performed from the power supply voltage VDDH until the power supply voltage VDDH is reached, and charging is performed by using the step-up circuit 210 until the remaining voltage VPI. As a result, a current supplied from the step-up circuit 210 can be reduced.

Hereinafter, as an example, it is assumed that the power supply voltage VDDH is 2.8 V, the ground potential VSSH is 0 V, the voltage VPI is 3.0 V, and the voltage VRL is −1.2 V. Since a load current is proportional to an amplitude ratio, a ratio of a current required for the step-up circuit 210 to a total current is as follows.

(VPI−VDDH)/(VPI−VRL)=0.2/4.2=4.8%

That is, assuming that a load current of the driver circuit 21 is 10 mA, a current required for the step-up circuit 210 is to be about 0.5 mA.

Furthermore, when loss α% with respect to a load current Iload is assumed, power consumption at a time of rising is expressed by the following formula.

$$VDDH \times Iload\ (1+\alpha) \qquad \text{Formula (1)}$$

In the above formula, assuming that the power supply voltage VDDH is 2.8 V and the loss α=50%, power consumption at a time of rising in a case where the entire current is supplied from the step-up circuit 210 is as follows.

2.8 V×10 mA (1+0.5)=42.0 mW

Whereas, power consumption at a time of rising in a case where only a current between the power supply voltage VDDH and the voltage VPI is supplied from the step-up circuit 210 is as follows.

2.8 V×0.5 mA (1+0.5)=2.1 mW

Next, at a time of falling of the drive signal VSOUT, the C switch 130 is turned on, and discharging is performed from the voltage VPI to the ground potential VSSH. Thereafter, when the ground potential VSSH is reached, the D switch 140 is then turned on, and discharging is performed from the ground potential VSSH to the voltage VRL. That is, instead of discharging from the voltage VPI to the voltage VRL all at once, discharging is performed to the ground potential VSSH until the ground potential VSSH is reached, and discharging is performed by using the step-down circuit 310 until the remaining voltage VRL. As a result, a current supplied from the step-down circuit 310 can be reduced.

As described above, since a load current is proportional to an amplitude ratio, a ratio of a current required for the step-down circuit 310 to the total current is as follows.

(VSSH-VRL)/(VPI-VRL)=1.2/4.2=29%

That is, assuming that the load current of the driver circuit 21 is 10 mA as described above, a current required for the step-down circuit 310 is to be about 2.9 mA.

Furthermore, power consumption at a time of falling is also expressed by Formula (1), and power consumption at a time of falling in a case where the entire current is supplied from the step-down circuit 310 is as follows.

2.8 V×10 mA (1+0.5)=42.0 mW

Whereas, power consumption at a time of rising in a case where only a current between the power supply voltage VDDH and the voltage VRL is supplied from the step-down circuit 310 is as follows.

2.8 V×2.9 mA (1+0.5)=12.2 mW

Furthermore, as a secondary effect of such improvement in power consumption, a switched capacitor capacitance (Cfly) can also be reduced to the same extent, which can also contribute to area reduction.

As described above, in the embodiment of the present technology, by switching once to the power supply voltage VDDH or the ground potential VSSH and extracting most of power from the power supply voltage VDDH or the ground potential VSSH at a time of rising or falling transition where the power is consumed most, power extracted from the step-up circuit 210 and the step-down circuit 310 is reduced, and power and an area of the step-up circuit 210 and the step-down circuit 310 can be reduced.

Note that, in the example described above, it is assumed that four types of voltages are selected by four switches and supplied to the drive signal output circuit 190. However, without limiting to this, the type of voltage and the number of switches may be changed as necessary.

[Circuit Configuration]

Figure 3:
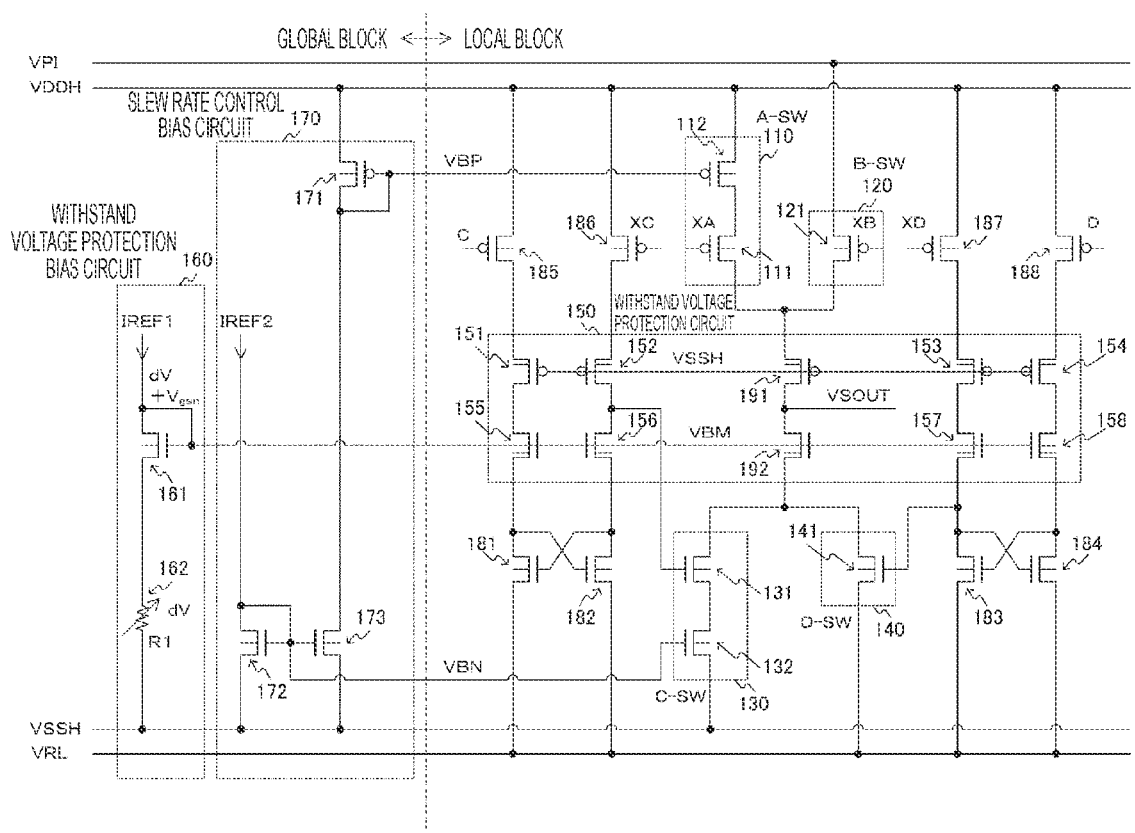
FIG. 3 is a diagram illustrating a circuit configuration example of the driver circuit 21 according to the embodiment of the present technology.

FIG. 3 is a diagram illustrating a circuit configuration example of the driver circuit 21 according to the embodiment of the present technology.

This driver circuit 21 uses the trigger signal TRG as an input signal. This figure illustrates selection signals XA, XB, C, XC, D, and XD generated from the trigger signal TRG. A relationship between these selection signals and the trigger signal TRG will be described later.

The A switch 110 includes PMOS transistors 111 and 112. The PMOS transistor 111 operates in accordance with the selection signal XA. The PMOS transistor 112 is a transistor for slew rate control, and operates in accordance with a control signal VBP from a slew rate control bias circuit 170 described later.

The B switch 120 includes a PMOS transistor 121. The PMOS transistor 121 operates in accordance with the selection signal XB.

The C switch 130 includes NMOS transistors 131 and 132. The NMOS transistor 131 operates in accordance with a signal from a PMOS transistor 186 that operates in accordance with the selection signal XC. The NMOS transistor 132 is a transistor for slew rate control, and operates in accordance with a control signal VBN from the slew rate control bias circuit 170 described later.

The D switch 140 includes an NMOS transistor 141. The NMOS transistor 141 operates in accordance with a signal from a PMOS transistor 187 that operates in accordance with the selection signal XD.

A PMOS transistor 191 and an NMOS transistor 192 output the drive signal VSOUT as the drive signal output circuit 190. This drive signal VSOUT has an amplitude of 4.2 V (=VPI-VRL) in the above-described example. Whereas, since withstand voltages of the PMOS transistor 191 and the NMOS transistor 192 are assumed to be 3 V, PMOS transistors 151 to 154 and NMOS transistors 155 to 158 are provided as a withstand voltage protection circuit 150 for withstand voltage protection of these transistors. Gate voltages of the PMOS transistors 191 and 151 to 154 are fixed to the ground potential VSSH, and gate voltages of the NMOS transistors 192 and 155 to 158 operate in accordance with a control signal VBM from a withstand voltage protection bias circuit 160 described later.

NMOS transistors 181 and 182 and NMOS transistors 183 and 184 individually are negative level shifters. Since the C switch 130 and the D switch 140 are controlled by the negative voltage VRL lower than the ground potential VSSH, signal generation for the C switch 130 and the D switch 140 is controlled via these negative level shifters.

PMOS transistors 185 and 186 are level shifters that control an amplitude of the NMOS transistor 131. PMOS transistors 187 and 188 are level shifters that control an amplitude of the NMOS transistor 141.

The withstand voltage protection bias circuit 160 is a circuit for generation of a gate bias signal VBM of the NMOS transistors 155 to 158 and 192 of the withstand voltage protection circuit 150. The withstand voltage protection bias circuit 160 includes an NMOS transistor 161 and a variable resistor 162. Note that the withstand voltage protection bias circuit 160 is an example of a voltage control bias circuit described in the claims.

The NMOS transistor 161 is a copy of the NMOS transistors 192 and 155 to 158 by a current mirror circuit. This configuration makes it possible to cancel process-voltage-temperature (PVT) variations.

The variable resistor 162 is a trimming resistor, and a voltage dV at both ends thereof is determined by a multiplier of a resistance value R1 and a current IREF1. Therefore, when a gate-to-source voltage of the NMOS transistor 161 is Vgsn, the output signal VBM of the withstand voltage protection bias circuit 160 is to be dV+Vgsn. When a withstand voltage of a transistor to be subjected to withstand voltage protection is 3.0 V, it is possible to achieve design matching the withstand voltage of the transistor by trimming the variable resistor 162 so as to obtain the following.

dV+Vgsn-Vgsn-VRL=dV-VRL <3.0 V

The slew rate control bias circuit 170 is a bias circuit to limit a current during a period in which the A switch 110 is turned on and to control a slew rate. This slew rate control bias circuit 170 includes a PMOS transistor 171 configured to generate the control signal VBP of the PMOS transistor 112, and NMOS transistors 172 and 173 configured to generate the control signal VBN of the NMOS transistor 132. Details of this slew rate control bias circuit 170 will be described later.

Figure 4:
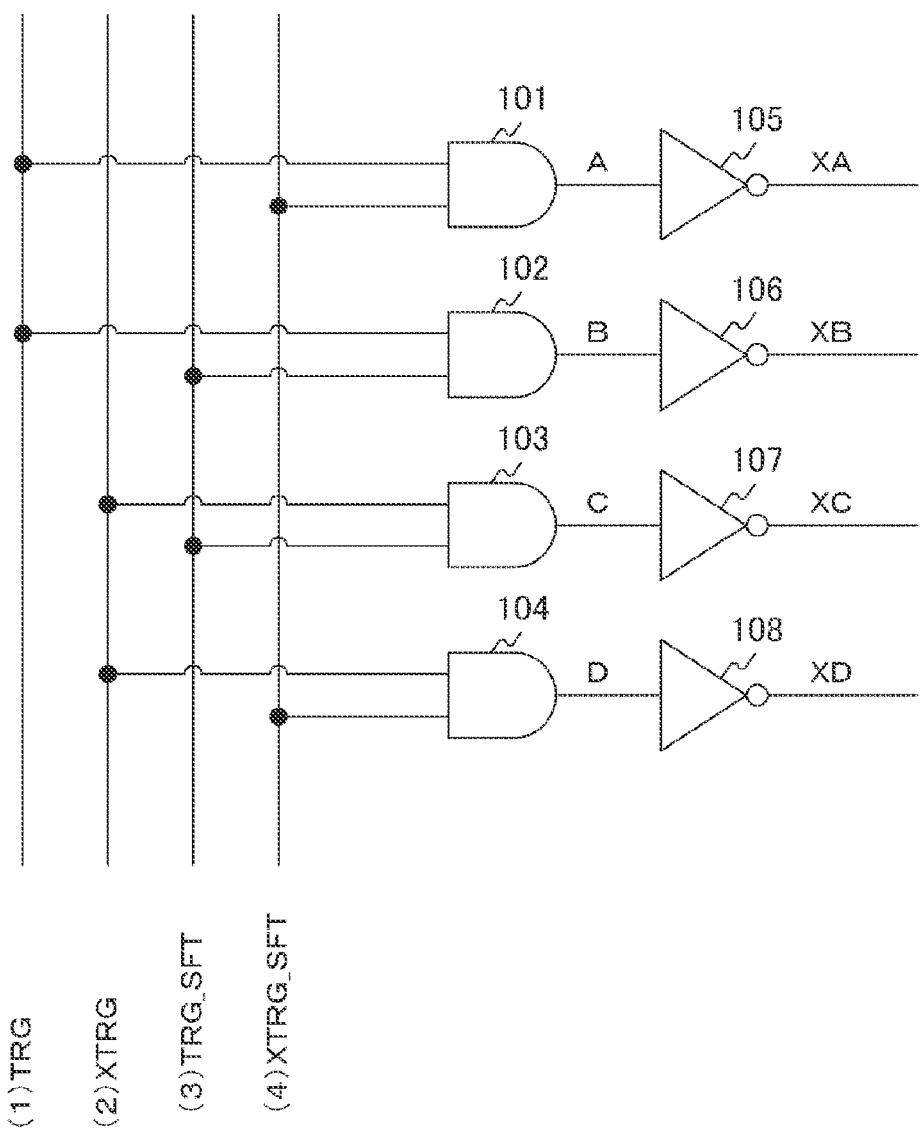
FIG. 4 is a diagram illustrating a circuit configuration example of an input control circuit according to the embodiment of the present technology.

FIG. 4 is a diagram illustrating a circuit configuration example of an input control circuit according to the embodiment of the present technology.

The driver circuit 21 uses the trigger signal TRG as an input signal, to generate an internal signal on the basis of this trigger signal TRG. That is, the driver circuit 21 inverts the trigger signal TRG to generate an inverted trigger signal XTRG. Furthermore, the driver circuit 21 shifts the trigger signal TRG to generate a shift trigger signal TRG_SFT. Moreover, the driver circuit 21 inverts the shift trigger signal TRG_SFT to generate an inverted shift trigger signal XTRG_SFT.

Then, by combining these signals, the driver circuit 21 generates selection signals necessary for controlling the A switch 110, the B switch 120, the C switch 130, and the D switch 140. An AND circuit 101 generates a logical product of the trigger signal TRG and the inverted shift trigger signal XTRG_SFT, and outputs a signal A. An AND circuit 102 generates a logical product of the trigger signal TRG and the shift trigger signal TRG_SFT, and outputs a signal B. An AND circuit 103 generates a logical product of the inverted trigger signal XTRG and the shift trigger signal TRG_SFT, and outputs a signal C. An AND circuit 104 generates a logical product of the inverted trigger signal XTRG and the inverted shift trigger signal XTRG_SFT, and outputs a signal D. Furthermore, inverters 105 to 108 invert the outputs A to D of the AND circuits 101 to 104, respectively, and output signals XA to XD. Note that the AND circuits 101 to 104 and the inverters 105 to 108 are examples of a control circuit described in the claims.

[Operation Timing]

Figure 5:
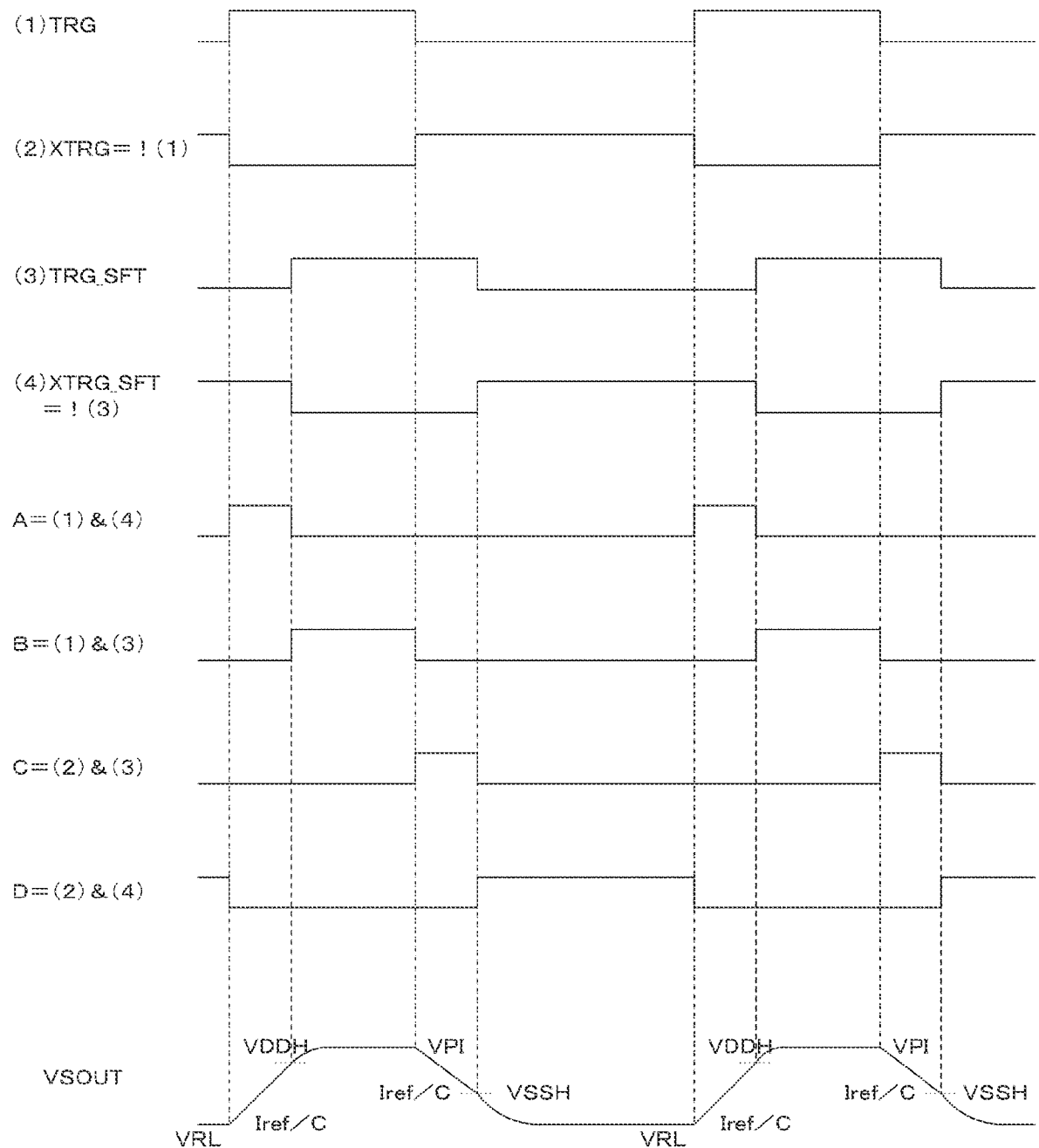
FIG. 5 is a view illustrating a timing example of a selection signal and a drive signal VSOUT according to the embodiment of the present technology.

FIG. 5 is a view illustrating a timing example of the selection signal and the drive signal VSOUT according to the embodiment of the present technology.

During a period in which the signal A is active, the A switch 110 is turned on, and the drive signal VSOUT is charged from the voltage VRL to the power supply voltage VDDH. This period is a precharge period. During a period in which the signal B is active, the B switch 120 is turned on, and the drive signal VSOUT is charged from the power supply voltage VDDH to the voltage VPI.

During a period in which the signal C is active, the C switch 130 is turned on, and the drive signal VSOUT is discharged from the voltage VPI to the ground potential VSSH. This period is a predischarge period. During a period in which the signal D is active, the D switch 140 is turned on, and the drive signal VSOUT is discharged from the ground potential VSSH to the voltage VRL.

<2. Slew Rate Control>

In the imaging device, since the driver circuit 21 is provided for each control signal and for each line, several thousands of pieces move simultaneously as a whole depending on implementation. In a case where they operate at the same time, a large peak current is generated, and the power supply voltage decreases due to an IR drop with a power supply parasitic resistance, which may cause malfunction. In order to prevent this, in the present embodiment, the slew rate control bias circuit 170 is provided as a constant current bias circuit that controls a current flowing via the A switch 110 and the C switch 130. As a result, slew rate control at a time of operation via the A switch 110 and the C switch 130 is performed. The slew rate is a change rate of an output signal. When the slew rate is slow, it becomes apparent as a slope of an output waveform. Therefore, the output waveform can be appropriately secured by control-ling this slew rate. Note that the slew rate control bias circuit 170 is an example of a current control bias circuit described in the claims.

Figure 6A:
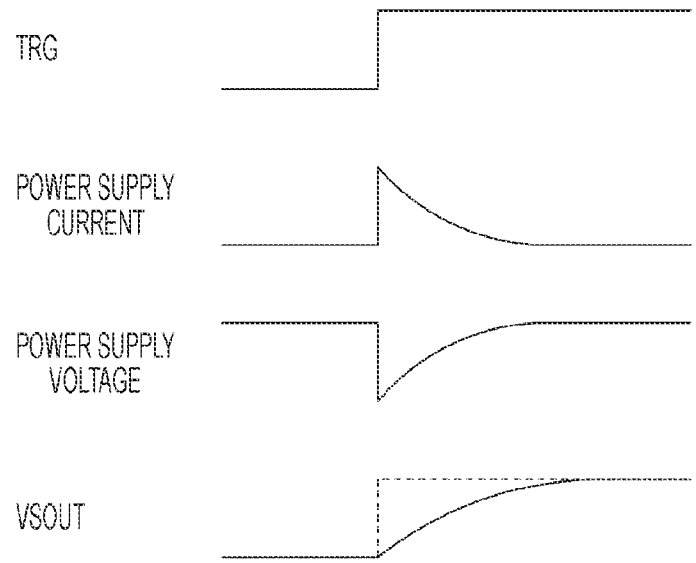
FIGS. 6A and 6B are views illustrating an operation example of slew rate control according to the embodiment of the present technology.
Figure 6B:
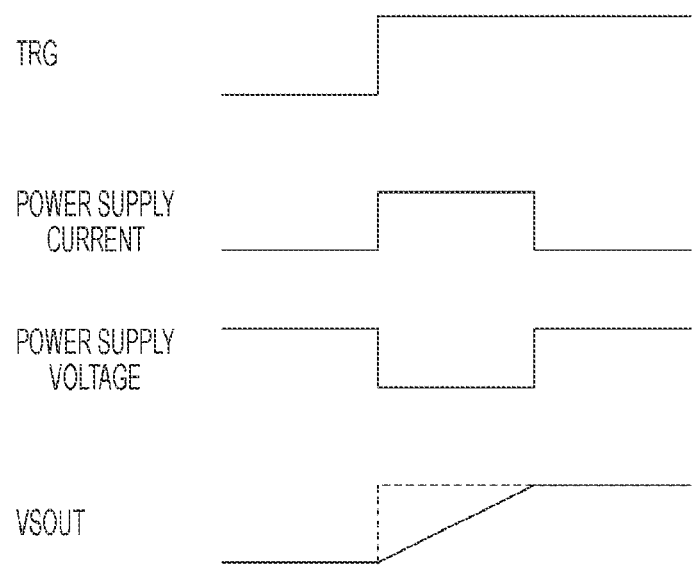

[Peak Current Suppression] FIGS. 6A and 6B are views illustrating an operation example of slew rate control according to the embodiment of the present technology.

FIG. 6A is an image example in a case of operating as a voltage driver without performing slew rate control. In the voltage driver, a current is determined by a size of a transistor and Vgs. In this case, a large peak occurs in a power supply current and a power supply voltage at a time of rising of the trigger signal TRG, and rounding occurs in the outputted drive signal VSOUT.

Whereas, FIG. 6B illustrates an example of a case of operating as a constant current driver by providing the slew rate control bias circuit 170. In the current driver, a flowing current is limited by a constant current source. In this case, since IREF1 is constant, a slope is determined by IREF1/C, and a large peak does not occur. Furthermore, by changing a size ratio or IREF2 of the PMOS transistor 171 and the NMOS transistor 173, it is possible to control to any slew rate.

[Improvement of Settling Time]

The driver circuit 21 according to the present embodiment functions as a current driver when the A switch 110 or the C switch 130 is turned on, and thereafter, functions as a voltage driver using the step-up circuit 210 or the step-down circuit 310 when the B switch 120 or the D switch 140 is turned on.

A time constant tau of the voltage driver is as follows.

tau=(Z+R)×C

Here, Z represents an output impedance of the driver, and R represents a wiring parasitic resistance. This voltage driver has the following two problems. First, Z needs to be sufficiently smaller than R in order to increase a speed, but a driver area increases. Second, a large driver size causes a large peak current to be instantaneously generated and the power supply voltage to drop, so that the driver output impedance Z increases at a time of transition, and settling further slows down. Therefore, the configuration of the voltage driver cannot essentially drive a large-capacity load, and the operation speed is limited.

Whereas, in the present embodiment, since the capacitor is initially charged with constant current control by the current driver, there is no influence of Z. By switching to a voltage driver after driving at a constant current in a certain fixed section, since a charge amount itself to be supplied by the voltage driver has been reduced, the power supply voltage drop is small. As a result, settling can be performed much faster than a case of driving all by the voltage driver, which contributes to speeding up.

Figure 7:
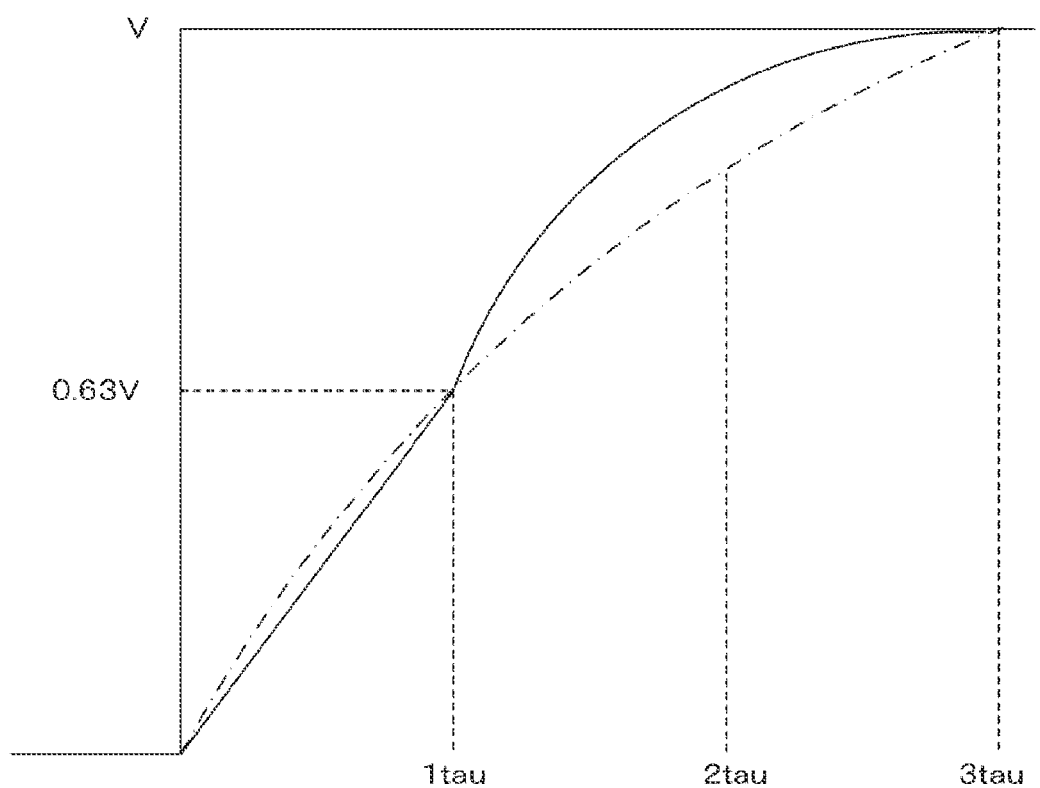
FIG. 7 is a view illustrating a comparative example of settling time according to the embodiment of the present technology.

FIG. 7 is a view illustrating a comparative example of settling time according to the embodiment of the present technology.

In the figure, a chain line indicates a waveform in a case where the step-up circuit 210 or the step-down circuit 310 is used from the beginning to operate as the voltage driver. In this case, from the beginning, the voltage increases curvi-linearly by the time constant tau (0.63 times).

Whereas, a solid line indicates, as an example, a waveform in a case where a current source is controlled by the current driver up to 0.63 times a target voltage V and switched to the voltage driver thereafter, in the driver circuit 21 of the present embodiment. In this case, the voltage increases linearly by the current driver at first, and then increases curvilinearly by the time constant tau described above. Since a necessary charge amount of 0.63 is supplied as the current driver, a charge amount to be supplied by the step-up circuit 210 and the step-down circuit 310 as the voltage driver only needs to be 0.63.

Figure 8A:
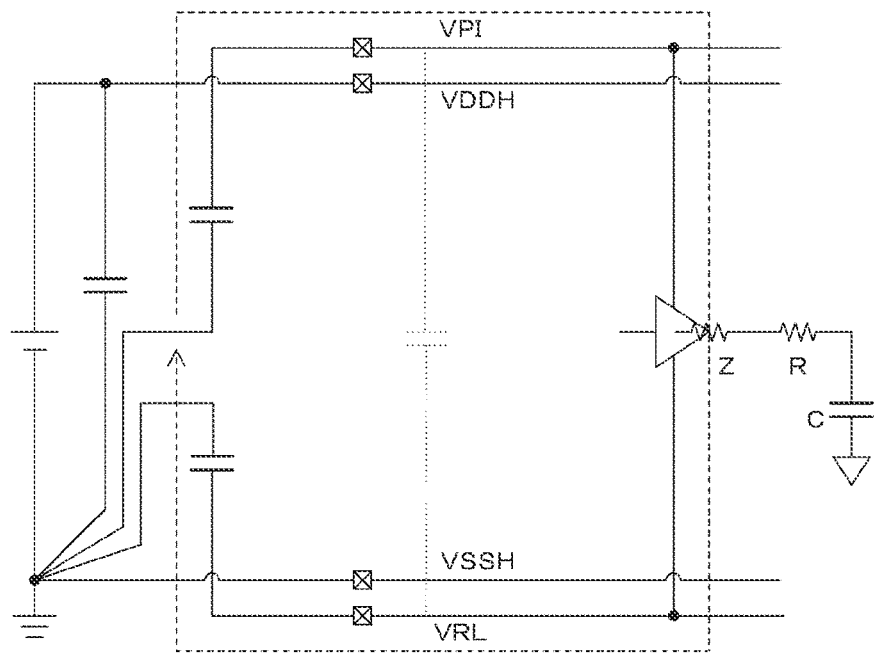
FIGS. 8A and 8B are diagrams illustrating a comparative example of a high frequency loop according to the embodiment of the present technology.
Figure 8B:
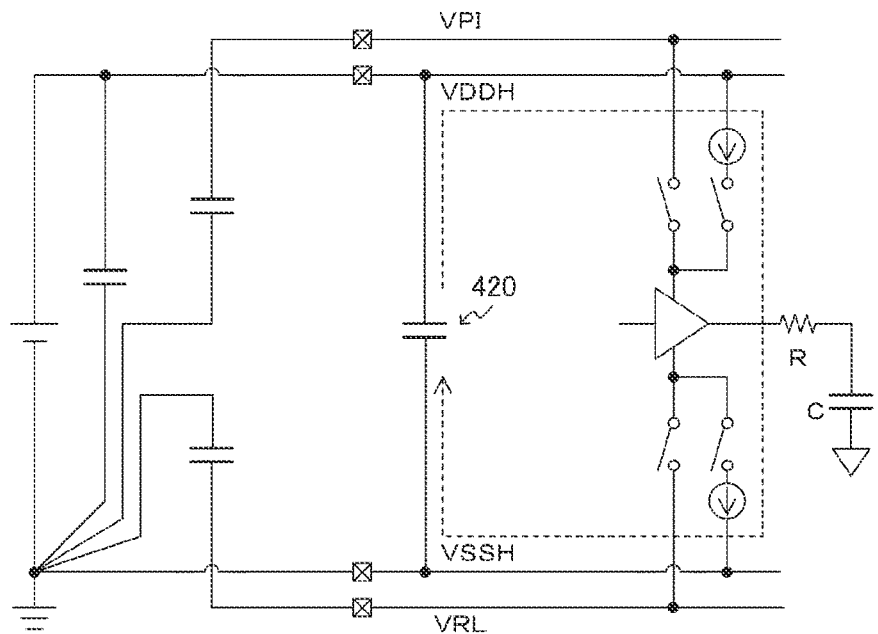

<3. EMI> FIGS. 8A and 8B are diagrams illustrating a comparative example of a high frequency loop according to the embodiment of the present technology.

As described above, in the present embodiment, the capacitor 420 is used to supply a current when the trigger signal TRG changes. Since an external capacitor does not perform high-frequency response, it is desirable to incorporate the capacitor 420 in this manner. On the other hand, as illustrated in FIG. 8A, in a configuration in which the voltage VPI and the voltage VRL are always supplied to the drive signal output circuit, it is difficult to arrange the capacitor since there is a possibility that an amplitude width increases and a voltage exceeds a withstand voltage of a capacitive element. Therefore, since an operation is performed to draw a current from outside at a time of transition, an unexpected large current loop occurs, which causes deterioration of electromagnetic interference (EMI).

In this regard, in the present embodiment, since most of the current is exchanged between the power supply voltage VDDH and the ground potential VSSH, the on-chip capacitor 420 can be arranged. As a result, as illustrated in FIG. 8B, the current loop can be made small, and EMI can be suppressed. Furthermore, since most frequency components become direct current components by adopting the constant current driver, harmonic components are smaller than those of the voltage driver, and consequently the size of the capacitor 420 can be made small.

<4. Bias Circuit>

The driver circuit 21 in the present embodiment includes the withstand voltage protection bias circuit 160 and the slew rate control bias circuit 170 as described above. Hereinafter, these are abbreviated as a bias circuit 167. In the driver circuit 21, the bias circuit 167 can be provided independently (a global block) of other circuits (a local block 109), and one bias circuit 167 can be arranged for a plurality of local blocks 109.

Figure 9:
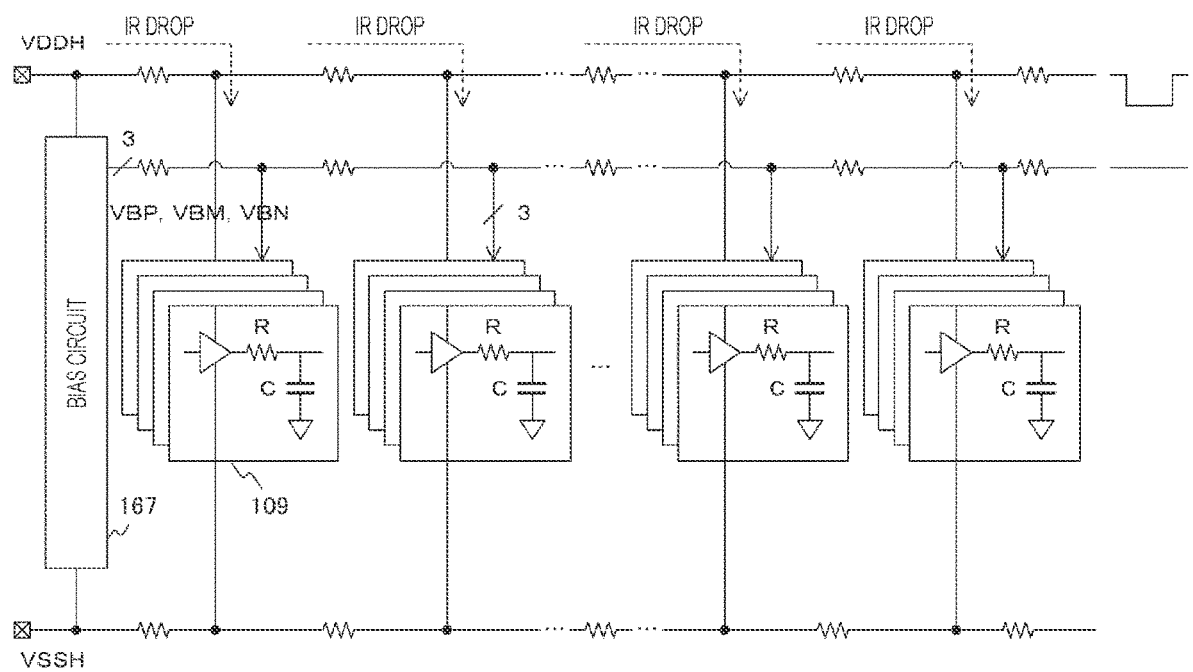
FIG. 9 is a diagram illustrating a first example of a relationship between a bias circuit 167 and a local block 109 in the driver circuit 21 according to the embodiment of the present technology.

FIG. 9 is a diagram illustrating a first example of a relationship between the bias circuit 167 and the local block 109 in the driver circuit 21 according to the embodiment of the present technology.

In this first example, a bias signal is distributed to the plurality of local blocks 109 for one bias circuit 167 via a long wiring line. As described above, in the imaging device, since several thousands of driver circuits 21 may be simultaneously used depending on implementation in a chip, a very large peak current is generated. In a case where the power supply pads cannot be arranged sufficiently, power supply IR drops are different at a near end and a far end of the pads. Whereas, since a bias signal group does not allow a current to flow, there is not much difference between the near end and the far end. Therefore, while there is no difference in Vgs and thus settling is fast at the near end, there is a problem that Vgs is small and settling is slow at the far end.

Figure 10:
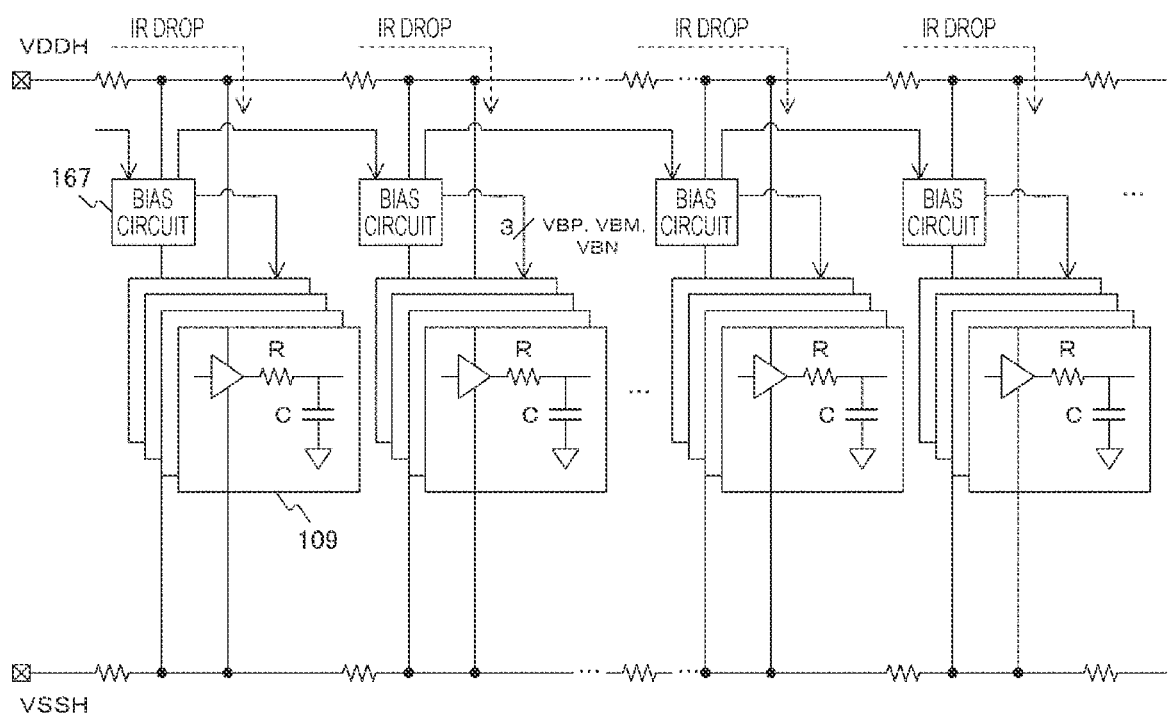
FIG. 10 is a diagram illustrating a second example of the relationship between the bias circuit 167 and the local block 109 in the driver circuit 21 according to the embodiment of the present technology.

FIG. 10 is a diagram illustrating a second example of the relationship between the bias circuit 167 and the local block 109 in the driver circuit 21 according to the embodiment of the present technology.

In this second example, the bias circuit 167 is arranged in a distributed manner for each of several local blocks 109. As a result, in accordance with a power supply drop at an arrangement position of the local block 109, the same amount of bias voltage can be dropped, the Vgs can be made constant, and the difference in settling can be eliminated.

Figure 11A:
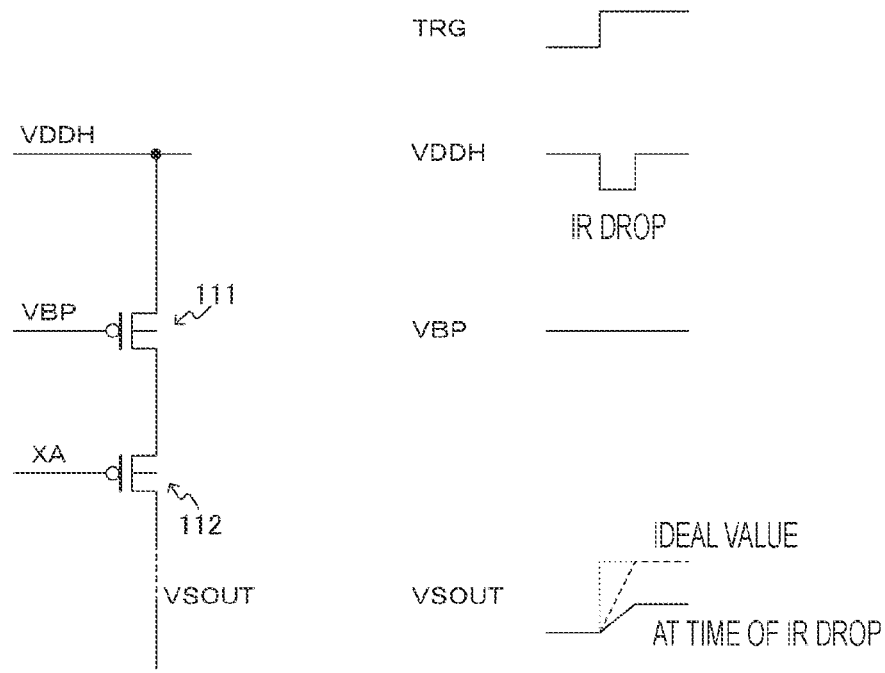
FIGS. 11A and 11B are diagrams illustrating a comparative example of the first and second examples of the relationship between the bias circuit 167 and the local block 109 in the driver circuit 21 according to the embodiment of the present technology.
Figure 11B:
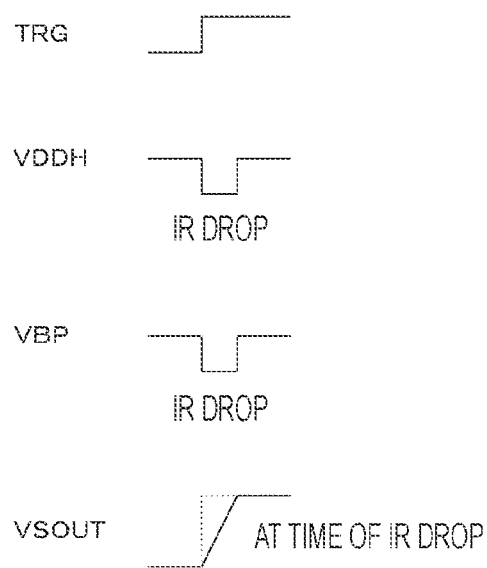

FIGS. 11A and 11B are diagrams illustrating a comparative example of the first and second examples of the relationship between the bias circuit 167 and the local block 109 in the driver circuit 21 according to the embodiment of the present technology.

Here, as an example, attention is paid to portions of the PMOS transistors 111 and 112 of the A switch 110. In FIG. 11A, as in the first example, the IR drop occurs in the power supply voltage VDDH at the pad far end with a change in the trigger signal TRG, but the bias signal VBP does not fluctuate, and consequently, Vgs of the PMOS transistor 111 decreases, and settling is delayed.

On the other hand, in FIG. 11B, the bias signal VBP also drops in accordance with the IR drop of the power supply voltage VDDH at the location, by distributing the bias circuit 167 as in the second example. As a result, Vgs is kept constant, and the difference in settling can be eliminated.

Figure 12:
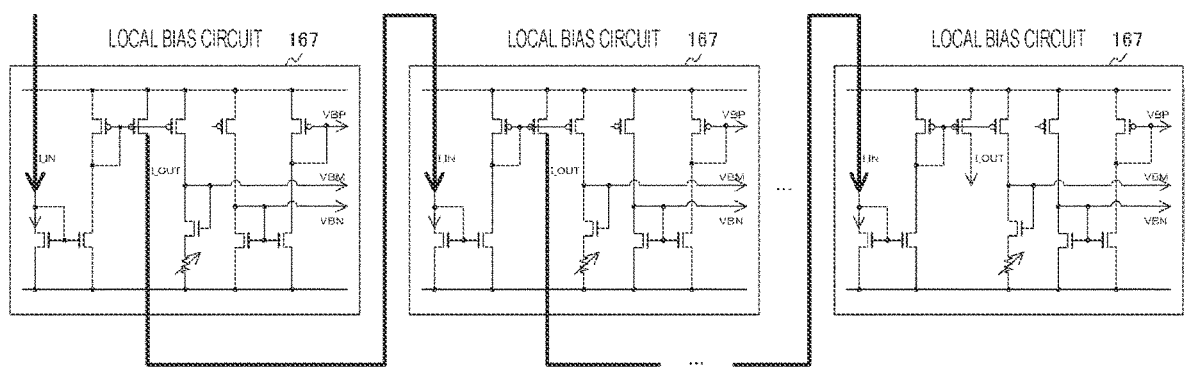
FIG. 12 is a diagram illustrating a connection example of a plurality of bias circuits 167 of the driver circuit 21 according to the embodiment of the present technology.

FIG. 12 is a diagram illustrating a connection example of a plurality of bias circuits 167 of the driver circuit 21 according to the embodiment of the present technology.

In a case where the plurality of bias circuits 167 is dispersedly arranged as in the second example described above, it is desirable to sequentially connect in a daisy chain. As a result, the number of wiring lines can be reduced.

Note that the embodiment described above is an example for embodying the present technology, and the matters in the embodiment and the matters used to specify the invention in the claims have a corresponding relationship. Similarly, the matters used to specify the invention in the claims and the matters in the embodiment of the present technology to which the same names are assigned have a corresponding relationship. However, the present technology is not limited to the embodiment, and can be embodied by applying various modifications to the embodiment without departing from the gist thereof.

Note that the effects described in this specification are merely examples and are not limited, and additional effects may be present.

Note that the present technology can also have the following configurations.

(1) A driver circuit including:

a drive signal output circuit configured to output a drive signal in accordance with a trigger signal that is predetermined;

a step-up switch configured to sequentially select a plurality of voltages in ascending order and supply a selected voltage to the drive signal output circuit, at a time of rising of the drive signal; and a step-down switch configured to sequentially select a plurality of voltages in descending order and supply a selected voltage to the drive signal output circuit, at a time of falling of the drive signal.

(2) The driver circuit according to (1), further including:

a control circuit configured to perform control by generating a selection signal in the step-up switch and the step-down switch, on the basis of the trigger signal.

(3) The driver circuit according to (1) or (2), in which at a time of rising of the drive signal, the step-up switch selects a first voltage until the first voltage is reached, and selects a second voltage higher than the first voltage until the second voltage is reached, to supply to the drive signal output circuit, and at a time of falling of the drive signal, the step-down switch selects a third voltage until the third voltage is reached, and selects a fourth voltage lower than the third voltage until the fourth voltage is reached, to supply to the drive signal output circuit.

(4) The driver circuit according to (3), further including:
a step-up circuit configured to generate the second voltage and supply to the step-up switch; and
a step-down circuit configured to generate the fourth voltage and supply to the step-down switch, in which the first voltage is a power supply voltage, and the third voltage is a ground potential.

(5) The driver circuit according to (4), further including:
a capacitor configured to connect between the power supply voltage and the ground potential.

(6) The driver circuit according to any one of (1) to (5), further including:
a voltage control bias circuit configured to control to supply a voltage within a withstand voltage of a transistor, to the transistor included in the drive signal output circuit.

(7) The driver circuit according to any one of (1) to (6), further including:
a current control bias circuit configured to control a current flowing through transistors included in the step-up switch and the step-down switch.

(8) An imaging device including:
a pixel region in which a plurality of imaging elements is arranged; and
a plurality of driver circuits including, individually corresponding to the plurality of imaging elements, a drive signal output circuit configured to output a drive signal to each of the imaging elements in accordance with a trigger signal that is predetermined, a step-up switch configured to sequentially select a plurality of voltages in ascending order to supply to the drive signal output circuit at a time of rising of the drive signal, and a step-down switch configured to sequentially select a plurality of voltages in descending order to supply to the drive signal output circuit at a time of falling of the drive signal.

(9) The imaging device according to (8), further including, for each predetermined number of the plurality of driver circuits, a bias circuit configured to supply a voltage within a withstand voltage of a transistor to the transistor included in the drive signal output circuit, and control a current flowing through transistors included in the step-up switch and the step-down switch.

(10) The imaging device according to (9), in which the bias circuit each is connected in a daisy chain.

REFERENCE SIGNS LIST

10 Pixel region
11 Pixel
20 Vertical drive circuit
21 Driver circuit
30 Horizontal drive circuit
40 Control circuit
50 Column signal processing circuit
60 Output circuit
101 to 104 AND circuit
105 to 108 Inverter
110 A switch
120 B switch
130 C switch
140 D switch
150 Withstand voltage protection circuit
160 Withstand voltage protection bias circuit
162 Variable resistor
167 Bias circuit
170 Slew rate control bias circuit
190 Drive signal output circuit
210 Step-up circuit
310 Step-down circuit
420 Capacitor
510 Wiring resistance
520 Parasitic capacitance
910 Power supply
911, 912, 921, 922 Pad

The invention claimed is:

1. A driver circuit, comprising:
a drive signal output circuit configured to output a drive signal based on with a trigger signal;
a step-up switch configured to sequentially select a first plurality of voltages in ascending order and supply a selected voltage of the first plurality of voltages to the drive signal output circuit, at a time of rising of the drive signal;
a step-down switch configured to sequentially select a second plurality of voltages in descending order and supply a selected voltage of the second plurality of voltages to the drive signal output circuit, at a time of falling of the drive signal; and
a current control bias circuit configured to control a current flowing through transistors included in the step-up switch and the step-down switch.

2. The driver circuit according to claim 1, further comprising:
a control circuit configured to generate a selection signal in the step-up switch and the step-down switch, based on the trigger signal.

3. The driver circuit according to claim 1, wherein
at the time of rising of the drive signal, the step-up switch is configured to select a first voltage of the first plurality of voltages until the first voltage is reached, and select a second voltage of the first plurality of voltages until the second voltage is reached, to sequentially supply the first voltage and the second voltage to the drive signal output circuit, wherein the second voltage is higher than the first voltage, and
at the time of falling of the drive signal, the step-down switch is configured to select a third voltage of the first plurality of voltages until the third voltage is reached, and select a fourth voltage of the first plurality of voltages until the fourth voltage is reached, to sequentially supply the third voltage and the fourth voltage to the drive signal output circuit, wherein the fourth voltage is lower than the third voltage.

4. The driver circuit according to claim 3, further comprising:
a step-up circuit configured to generate the second voltage and supply to the step-up switch; and
a step-down circuit configured to generate the fourth voltage and supply to the step-down switch, wherein
the first voltage is a power supply voltage, and
the third voltage is a ground potential.

5. The driver circuit according to claim 4, further comprising:
a capacitor configured to connect between the power supply voltage and the ground potential.

6. The driver circuit according to claim 1, further comprising:
a voltage control bias circuit configured to control to supply a voltage within a withstand voltage of a transistor, to the transistors included in the drive signal output circuit.

7. An imaging device, comprising:
a pixel region which includes a plurality of imaging elements; and a plurality of driver circuits including, individually corresponding to the plurality of imaging elements,
- a drive signal output circuit configured to output a drive signal to each of the plurality of imaging elements based on with a trigger signal,
- a step-up switch configured to sequentially select a first plurality of voltages in ascending order to supply to the drive signal output circuit at a time of rising of the drive signal,
- a step-down switch configured to sequentially select a second plurality of voltages in descending order to supply to the drive signal output circuit at a time of falling of the drive signal, and
- a current control bias circuit configured to control a current flowing through transistors included in the step-up switch and the step-down switch.

8. The imaging device according to claim 7, wherein, for each predetermined number of the plurality of driver circuits, the current control bias circuit is configured to supply a voltage within a withstand voltage of a transistor, to the transistors included in the drive signal output circuit.

9. The imaging device according to claim 8, wherein each current control bias circuit is connected in a daisy chain.

* * * * *